(12) United States Patent
Okamoto et al.

(10) Patent No.: US 8,433,164 B2
(45) Date of Patent: Apr. 30, 2013

(54) OPTICAL JOINT

(75) Inventors: Takeshi Okamoto, Tokyo (JP); Kenji Sato, Tokyo (JP); Tomoaki Kato, Tokyo (JP); Kenji Mizutani, Tokyo (JP)

(73) Assignee: NEC Corporation, Tokyo (JP)

( * ) Notice: Subject to any disclaimer, the term of this patent is extended or adjusted under 35 U.S.C. 154(b) by 214 days.

(21) Appl. No.: 13/119,255

(22) PCT Filed: Oct. 8, 2009

(86) PCT No.: PCT/JP2009/005247
§ 371 (c)(1),
(2), (4) Date: Mar. 16, 2011

(87) PCT Pub. No.: WO2010/041454
PCT Pub. Date: Apr. 15, 2010

(65) Prior Publication Data
US 2011/0188804 A1    Aug. 4, 2011

(30) Foreign Application Priority Data
Oct. 10, 2008   (JP) ................................. 2008-263535

(51) Int. Cl.
*G02B 6/26* (2006.01)
(52) U.S. Cl.
USPC .............................................. 385/47; 385/50
(58) Field of Classification Search .................... 385/47, 385/50
See application file for complete search history.

(56) References Cited

U.S. PATENT DOCUMENTS 7,539,378 B2 *   5/2009   Takabayashi et al. .......... 385/40
2004/0145800 A1   7/2004   Devaux et al.

FOREIGN PATENT DOCUMENTS

| JP | 11-87844 A | 3/1999 |
|---|---|---|
| JP | 2004325999 A | 11/2004 |
| JP | 2004361660 A | 12/2004 |
| JP | 2006323135 A | 11/2006 |
| JP | 2007532980 A | 11/2007 |
| JP | 2008176145 A | 7/2008 |
| WO | 2006077641 A | 7/2006 |
| WO | 2007020778 A | 2/2007 |
| WO | 2008107963 A | 9/2008 |

OTHER PUBLICATIONS

International Search Report for PCT/JP2009/005247 mailed Dec. 15, 2009.
M. Kohtoku et al., "Spotsize Converter With Improved Design for InP-Based Deep-Ridge Waveguide Structure", Journal of Lightwave Technology, vol. 23, No. 12, Dec. 2005, pp. 4207-4214.

* cited by examiner

*Primary Examiner* — Jerry Rahll

(57) ABSTRACT

An optical joint (1) includes a 2×2 MMI coupler (30) and a 2×2 MMI coupler (31) joined to the 2×2 MMI coupler (30). The 2×2 MMI coupler (30) includes a port (32) and a port (33) at one side. The 2×2 MMI coupler (31) includes a port (34) and a port (35) at one side. A light-absorbing region (20) is connected to the port (33), and a light-absorbing region (second light-absorbing section) (21) is connected to the port (34). A reflecting boundary (22) that reflects light propagated through the 2×2 MMI coupler (30) or the 2×2 MMI coupler (31) is formed at the junction portion between the 2×2 MMI coupler (30) and the 2×2 MMI coupler (31).

12 Claims, 9 Drawing Sheets

OPTICAL JOINT

The application is the National Phase of PCT/JP2009/005247, filed Oct. 8, 2009, which is based on Japanese Patent Application No. 2008-263535, filed Oct. 10, 2008, the content of which is incorporated hereinto by reference.

TECHNICAL FIELD

The present invention relates to an optical joint.

BACKGROUND ART

The need for miniaturization of optical part packages and higher functionality has increased year after year, and integration of optical devices has proceeded with this. For this reason, it is required to consider methods of integrating the optical devices, material for selection thereof, and device structures.

First, when different functional elements such as a wavelength variable filter or a modulator are integrated into a light-emitting element such as a laser, it is preferable that the materials of each of the functional elements are formed using an optimal one in accordance with each of the characteristics. Materials used in the optical devices include a compound semiconductor-based material, a silicon-based material, and a quartz-based material.

Next, in the functional elements in which a compound semiconductor is used for a portion of a region or the entire region among the materials, it is preferable that from the viewpoints of the device size, high-speed responsiveness, reliability and the like, structures of each of the functional elements are formed using optimal one in accordance with each of the characteristics. The structures include a core structure and a waveguide structure.

First, the core structure will be described. The core structure can be divided into an active region with a layer having a small band-gap energy in order to obtain an optical gain in the objective wavelength, and a passive region with a layer having a large band-gap energy. The band gap can be adjusted by the layer thickness, the crystal composition ratio, and crystal distortion caused by the crystal composition ratio. In addition, the active region and the passive region can, respectively, have different physical properties by changing the types of constituent atom materials.

Next, the waveguide structure will be described. The three main types of waveguide structures often used in the optical device are a deep-ridge waveguide structure, a rib waveguide structure, and an embedded waveguide structure (FIG. 7).

FIG. 7A is a schematic diagram illustrating an example of a deep-ridge waveguide structure. As shown in FIG. 7A, a ridge-shaped lamination composed of clads 11 and a core 12 interposed between the clads 11 is formed on a substrate 10. A deep-ridge waveguide structure has a shape in which the portion on the side of the waveguide is replaced by a low refractive index material such as air or a dielectric across the core structure in the vertically direction. For this reason, the structure is characterized in that a refractive index contrast between a semiconductor and a low refractive index material is large, and that radiation loss hardly increases even when the waveguide is steeply bent. Consequently, the deep-ridge waveguide structure is used in forming a device, in which a curved waveguide is heavily used, in a small size. In addition, it is possible to reduce the electrical capacitance by filling both of the sides of the deep-ridge waveguide with a low refractive index, that is, a low refractive index material. In this case, since the charging time of the capacitance portion at the time of signal modulation is shortened, the structure is also used in a device requiring high-speed operation.

FIG. 7B is a schematic diagram illustrating an example of a rib waveguide structure. As shown in FIG. 7B, a lamination composed of the clads 11 and the core 12 interposed between the clads 11 is formed on the substrate 10, and the clad 11 formed on the upper portion of the core 12 is formed in a ridge shape. The rib waveguide structure has a shape in which a clad layer above the core structure is replaced by a low refractive index material such as air or a dielectric. In this structure, since the core structure is not processed in order to form the waveguide, lattice defects hardly occur. As a result, even when a localized rise in temperature due to current injection occurs, an increase in lattice defects leading to the device degradation is also hardly brought about, and thus good reliability is obtained. Consequently, the rib waveguide structure is often used in gain devices associated with the current injection, such as a laser, an LED, and an optical amplifier.

FIG. 7C is a schematic diagram illustrating an example of an embedded waveguide structure. As shown in FIG. 7C, the clad 11 and the core 12 embedded in the clad 11 are formed on the substrate 10. The embedded waveguide structure has a shape in which the portion on the side of the waveguide is replaced by a semiconductor material having a smaller refractive index than that of the core structure. In this structure, since damage caused by processing for waveguide formation is restored by crystal regrowth, lattice defects hardly occur. As a result, similarly to the rib waveguide, even when a localized rise in temperature due to current injection occurs, an increase in lattice defects leading to the device degradation is also hardly brought about, and thus good reliability is obtained. Consequently, the embedded waveguide structure is often used in gain devices associated with the current injection, such as a laser, an LED, and an optical amplifier. In addition, the embedded waveguide structure has a defect that a process is complicated, but has better carrier confinement than that of the rib waveguide structure. In addition, like the deep-ridge waveguide structure, a leakage current through the lateral side of an exposed semiconductor is also hardly generated in the embedded waveguide structure. For this reason, when the structure is applied to a laser, it is possible to reduce a threshold, and to perform a high-efficiency operation.

There is no waveguide structure or core structure which is the most suitable to any and all devices. Therefore, it is important to use the waveguide structure or the core structure suitable to each of the devices in order to improve performance as the integrated device as a whole.

One of monolithic integration methods of two types of core structures is a known butt-joint technique in which a portion of the core structure is processed by dry etching and the like, and a separate core structure is newly formed by crystal growth such as Metal-Organic Vapor Phase Epitaxy (MOVPE) or Chemical Beam Epitaxy (CBE) (Patent Document 1).

Since each of the waveguide structures has a significantly different cross-sectional shape, the electric field distributions in a waveguide mode are also different from each other. When a direct connection is performed, a portion of a non-conforming component of the electric field distribution in the waveguide mode becomes reflected return light. The reflected return light causes laser noise. Thus, even when the relative amount of return light is an extremely small amount of $10^{-6}$ or so, a change in the characteristics occurs. Specifically, the optical output, the number of oscillation modes, the oscillation spectrum, the noise intensity, and the response output waveform at the time of modulation are changed. An associated technique includes, for example, Non-Patent Document 1. In this method, the waveguide width is adjusted so as to match the electric field distributions in the waveguide mode to each other in the interface between the deep-ridge structure and the embedded structure, and the shape of the waveguide in the vicinity of the interface is gradually changed to a tapered shape. Thereby, a sudden change in the waveguide mode is suppressed, and the reflected return light is suppressed.

RELATED DOCUMENT

Patent Document

[Patent Document 1] Japanese Unexamined Patent Publication No. 11-87844

Non-Patent Document

[Non-Patent Document 1] J. Lightwave Technology, 23(12), pp. 4207-4214, 2005

DISCLOSURE OF THE INVENTION

However, the optical joints disclosed in the above-mentioned documents have the following problems.

Firstly, the connection of the different waveguide structures to each other does not reach a sufficient reduction in the reflectance in practice. This is because that since the deep-ridge waveguide structure, the rib waveguide structure, and the embedded waveguide structure mentioned above, respectively, have significantly different cross-sectional structures, it is difficult in design to completely arrange the electric field distribution of each waveguide in the waveguide mode. In addition, since each of the waveguide structures is often formed by a separate process, deviation occurs at the waveguide in the interface due to the position deviation of exposure and the like, which may lead to the reflected return light.

Secondly, the butt-joint (BJ) technique for connecting different core structures to each other also does not reach a sufficient reduction in the reflectance in practice. This is because since high-accuracy etching and crystal regrowth technique are required, shape control is difficult. Therefore, the reflected return light is created by the BJ.

The present invention is contrived in view of such circumstances, and an object thereof is to provide a technique capable of suppressing the influence of reflected return light generated on the device characteristics, in an optical joint having a reflecting boundary in which the reflected return light is created.

According to the invention, there is an optical joint including:

a first multimode interference coupler; and a second multimode interference coupler joined to the first multimode interference coupler, wherein the first multimode interference coupler includes a first port and a second port at one side, and a third port and a fourth port at the other side, the second multimode interference coupler includes a fifth port and a sixth port at one side, and a seventh port and an eighth port at the other side, the third port and the fifth port are joined to each other, the fourth port and the sixth port are joined to each other, a first light-absorbing section is connected to the second port, a second light-absorbing section is connected to the seventh port, and a reflecting boundary that reflects light propagated through the first multimode interference coupler or the second multimode interference coupler is provided to a junction portion between the first multimode interference coupler and the second multimode interference coupler.

According to the invention, it is possible to suppress the influence of the reflected return light on other integrated devices by leading the reflected return light generated at the reflecting boundary to the light-absorbing region. Thereby, it is possible to provide an optical integrated device in which a material, a waveguide structure and a core structure, most suitable to each of the regions, are disposed while residual reflection is suppressed.

BRIEF DESCRIPTION OF THE DRAWINGS

The above-mentioned objects, other objects, characteristics and advantages will be further obvious from the following preferred exemplary embodiments and the accompanying drawings.

EXEMPLARY EMBODIMENT

Figure 1:
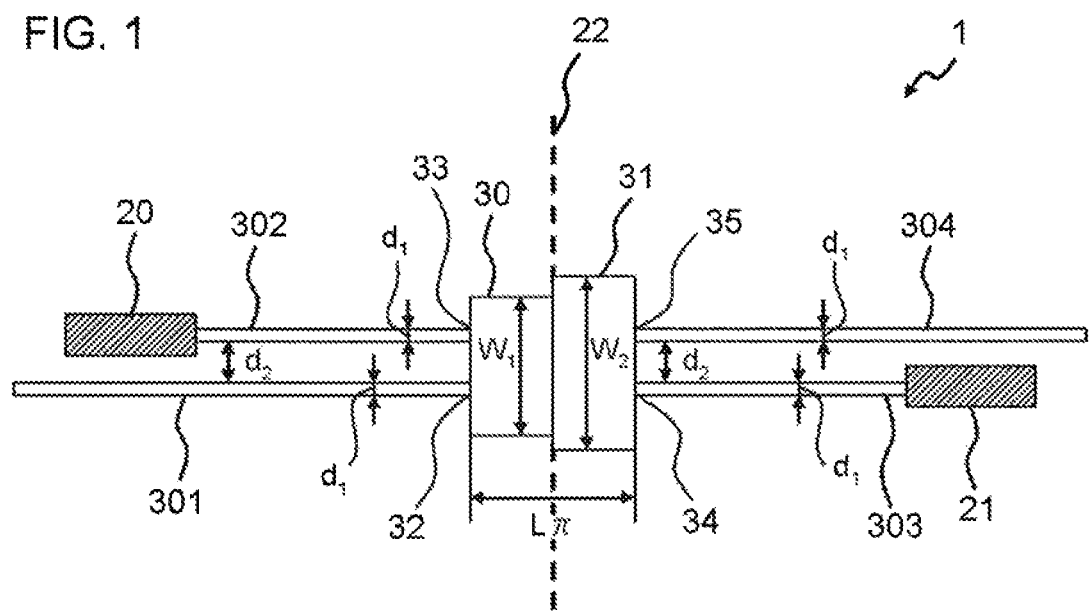
FIG. 1 is a plan view illustrating an optical joint according to a first exemplary embodiment.

Hereinafter, the exemplary embodiment of the invention will be described with reference to the accompanying drawings. In all the drawings, like elements are referenced by like reference numerals and descriptions thereof will not be repeated.

First Exemplary Embodiment

FIG. 1 is a plan view illustrating an optical joint 1 according to the exemplary embodiment. The optical joint 1 includes a 2×2 MMI coupler (first multimode interference coupler) 30 and a 2×2 MMI coupler (second multimode interference coupler) 31 joined to the 2×2 MMI coupler 30. The 2×2 MMI coupler 30 includes a port 32 (first port) and a port 33 (second port) atone end section, and includes a third port and a fourth port at the opposite end section thereof. The 2×2 MMI coupler 31 includes a fifth port and a sixth port at one end section, and includes a port 34 (seventh port) and a port 35 (eighth port) at the opposite end section thereof. The third port and the fifth port are joined to each other, and the fourth port and the sixth port are joined to each other. A light-absorbing region 20 (first light-absorbing section) is connected to the port 33 through an optical waveguide 302. In addition, a light-absorbing region 21 (second light-absorbing section) is connected to the port 34 through an optical waveguide 303. A reflecting boundary 22 that reflects light propagated through the 2×2 MMI coupler 30 or the 2×2 MMI coupler 31 is provided to the junction portion between the 2×2 MMI coupler 30 and the 2×2 MMI coupler 31.

Hereinafter, the optical joint 1 will be described in detail.

Figure 8:
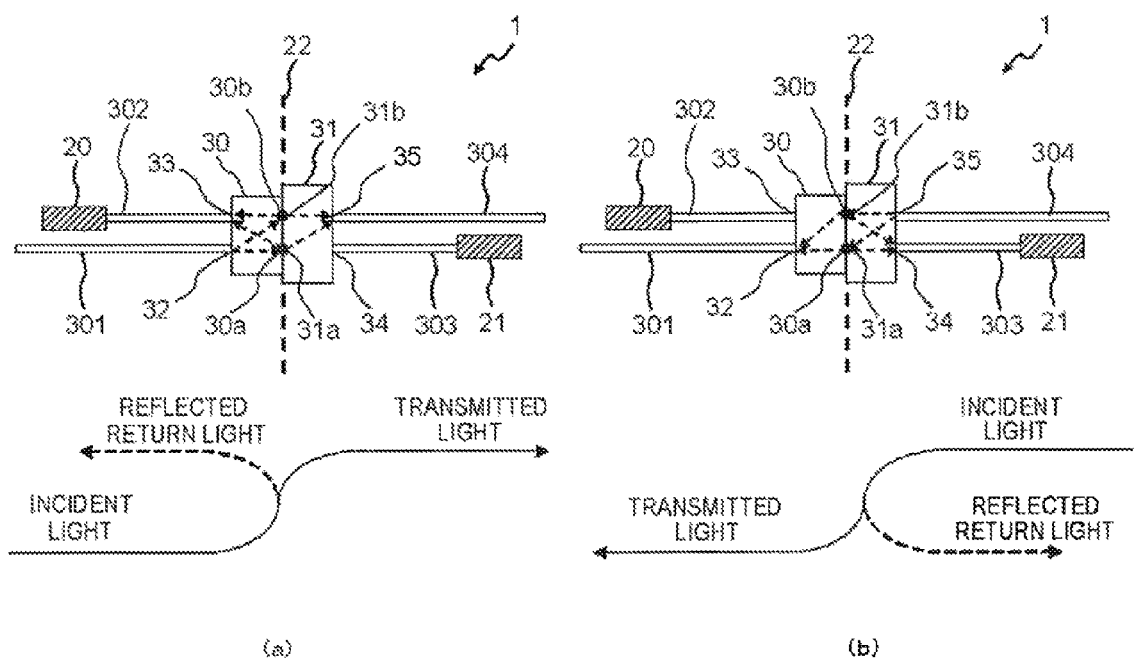
FIG. 8 is a diagram for explaining operations of the optical joint according to the exemplary embodiments.

As shown in FIG. 1 and FIG. 8, the optical joint 1 is an optical joint that propagates light. The optical joint 1 includes the 2×2 MMI coupler 30 and the 2×2 MMI coupler 31. The 2×2 MMI coupler 30 includes the port 32 and the port 33 at one side, and the 2×2 MMI coupler 31 includes the port 34 and the port 35 at one side. A port 30a on the side opposite to the port 32 of the 2×2 MMI coupler 30 and a port 31a of the 2×2 MMI coupler 31 are connected facing to each other. In addition, a port 30b on the side opposite to the port 33 of the 2×2 MMI coupler 30 and a port 31b of the 2×2 MMI coupler 31 are connected facing to each other. The light-absorbing region 20 is connected to the port 33, and the light-absorbing region 21 is connected to the port 34.

In the exemplary embodiment, the reflecting boundary 22 means a region in which reflected return light is created. The junction surface of the ports 30a and 31a becomes a reflecting surface that reflects light, and the reflected return light is created at the reflecting surface. In addition, the junction surface of the ports 30b and 31b becomes a reflecting surface that reflects light, and the reflected return light is created at the reflecting surface. That is, the reflecting boundary 22 is provided to the junction surface between the ports 30a and 31a and the junction surface between the ports 30b and 31b, respectively.

Moreover, in the exemplary embodiment, the port means an entry and exit port for light. In other words, the ports 32, 33, 30a, and 30b mean end sections at which the light is input and output to/from the 2×2 MMI coupler 30, and the ports 34, 35, 31a, and 31b mean end sections at which the light is input and output to/from the 2×2 MMI coupler 31. An optical waveguide 301 is joined to the port 32, and an optical waveguide 304 is joined to the port 35. The light is input from the outside to the 2×2 MMI couplers 30 and 31 through the optical waveguides 301 and 304, or the light is output from the 2×2 MMI couplers 30 and 31 to the outside through the optical waveguides 301 and 304. The optical waveguides 301 and 304 can be connected to, for example, a laser, an LED, a modulator, and an optical switch.

The light-absorbing regions 20 and 21 mean regions into which the reflected return light created at the reflecting boundary 22 is absorbed. A layer having a large band gap is provided to the light-absorbing regions 20 and 21. For example, an optical receiver or an optical attenuator can be provided to the light-absorbing regions 20 and 21.

Materials of the 2×2 MMI couplers 30 and 31 include a compound semiconductor-based material, a silicon-based material, and a quartz-based material. InP-based and GaAs-based materials can be generally used in the compound semiconductor-based material, and specifically, materials such as InGaAsP, InGaAs, AlGaInAs, and InGaAlAs can be used. In addition, materials such as Si, Ge, SiGe, and SiC can be used in the silicon-based material. In addition, materials such as SiN, SiO$_2$, and SiON can be used in the quartz-based material.

The 2×2 MMI couplers 30 and 31 are composed of a multimode waveguide region in which not only fundamental mode light but also higher-order mode light such as first-order mode light and second-order mode light is guided, and two ports which are connected to one end of the multimode waveguide region. The port has a narrower waveguide width ($d_1$) than the widths ($W_1$, $W_2$) of the above-mentioned multimode waveguide region.

The 2×2 MMI couplers 30 and 31 are structures including the multimode waveguide region, and this multimode waveguide region is designed so that the intensity of light incident from one port is equally distributed to two points at the end on the side opposite to the incidence by a multimode interference (MMI) theory. A circuit in which the multimode waveguide region is used has a small loss of light and a characteristic of easy fabrication, and thus has recently been in widespread use.

This MMI theory has hitherto been chiefly known as a theory for designing a branching and merging optical waveguide. (For example, "Journal of Lightwave Technology, Vol. 13, No. 4, 1995, 615 to 627 pages (author: Lucas B. Soldano)"). The MMI length $L\pi$ generally derived by this MMI theory is specifically expressed by the following Expressions (1) and (2).

[Expression 1]

$$W_e \cong W_1 + (\lambda_0/\pi)(n_c/n_r)^{2\sigma}(n_r^2 - n_c^2)^{-1/2} \qquad (1)$$

[Expression 2]

$$L_\pi \cong 4n_r W_e^2 / 3\lambda_0 \qquad (2)$$

Here, $W_1$ is a width of the multimode waveguide region, $n_r$ is a refractive index of the waveguide, $n_c$ is a refractive index of a clad, $\lambda_0$ is a wavelength of the incident light, and σ is zero when being a TE mode and is 1 when being a TM mode.

According to the MMI theory, when light is incident from one port of the 2×2 MMI coupler and the condition of Expression (3) is satisfied, the intensity of light guided through the multimode waveguide region is equally distributed to two points, and thus the region operates as a branching filter.

[Expression 3]

$$L = nL_\pi/2 \ (n=1,3,5\ldots) \qquad (3)$$

In addition, the condition of Expression (4) is satisfied, light guided through the multimode waveguide region exhibits the property of converging on one point.

[Expression 4]

$$L = nL_\pi/2 \ (n=2,4,6\ldots) \qquad (4)$$

For example, when the 2×2 MMI couplers 30 and 31 are made of the compound semiconductor-based material, the widths $d_1$ of each of the ports 32, 33, 34, and 35 can be set to 1.5 μm or so. In addition, the widths $W_1$ and $W_2$ of the multimode waveguide region can be set to 9.5 μm or so. In addition, the length $L\pi$ of the multimode waveguide region can be set to 120 μm or so.

In addition, when the 2×2 MMI couplers 30 and 31 are made of the silicon-based material, $d_1$ can be set to 0.5 μm or so, $W_1$ and W can be set to 10.5 μm or so, and $L\pi$ can be set to 150 μm or so. In addition, when the 2×2 MMI coupler 30 is made of the quartz-based material, $d_1$ can be set to 2 μm or so, $W_1$ and $W_2$ can be set to 9.0 μm or so, and $L\pi$ can be set to 110 μm or so.

The distances $d_2$ between the ports 32 and 33 and between the ports 34 and 35 can be set to 3 μm or so regardless of materials.

Subsequently, operations of the optical joint 1 will be described.

The operations of the optical joint 1 have a first mode in which light is input from the outside to the port 32 and a second mode in which light is input from the outside to the port 35. FIG. 8 are diagram for explaining the operations of the optical joint 1.

FIG. 8(a) is a diagram illustrating the operation in the first mode. As shown in FIG. 8(a), the light incident from the port 32 passes through the 2×2 MMI coupler 30 once, whereby the intensity thereof is equally distributed to the end sections 30a and 30b, respectively.

When the reflected return light is created at the reflecting boundary 22, the reflected return light passes through the 2×2 MMI coupler 30 one more time, whereby it is coupled to the port 33 of the 2×2 MMI coupler 30 from the coherence of light of the optical coupler, and then is led to the light-absorbing region 20 and is absorbed thereinto.

Figure 9:
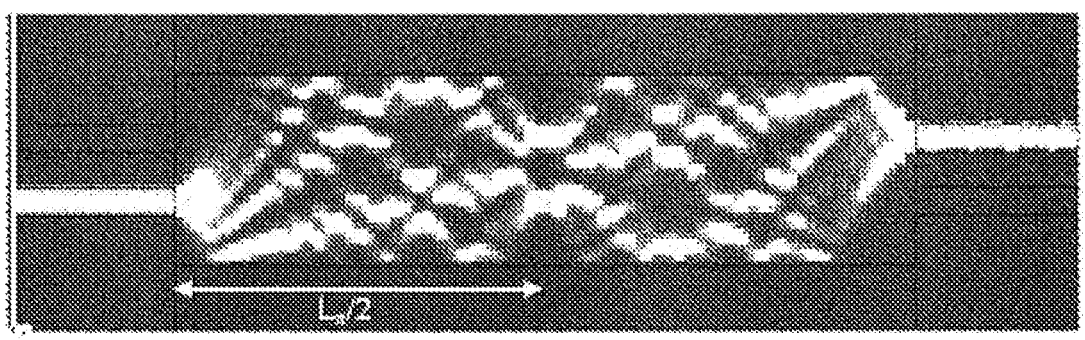
FIG. 9 is a diagram illustrating a simulation result of the optical joint.

In addition, the light transmitted through the reflecting boundary 22 is input to the 2×2 MMI coupler 31. The 2×2 MMI coupler 31 and the 2×2 MMI coupler 30 are designed so that the points of intensity distribution are the same. Thereupon, the light input to the 2×2 MMI coupler 31 passes through the 2×2 MMI coupler 30 once, whereby the most part of the light is coupled to the port 35, and is hardly coupled to the port 34. FIG. 9 shows a simulation result of the optical joint 1 in the first mode.

From the above, the light incident through the port 32 of the 2×2 MMI coupler 30 is through the optical joint 1, and thus reflected light can be absorbed into the light-absorbing region 20 through the port 33 of the 2×2 MMI coupler 30. In addition, transmitted light can be output from the port 35 of the 2×2 MMI coupler 31. Therefore, even when the reflecting boundary 22 exists between the 2×2 MMI coupler 30 and the 2×2 MMI coupler 31, the reflected return light created can be locally absorbed. Therefore, it is possible to suppress the incidence of the reflected return light on a semiconductor laser and the like.

FIG. 8(b) is a diagram illustrating an operation in the second mode. As shown in FIG. 8(b), the light incident from the port 35 passes through the 2×2 MMI coupler 31 one time, whereby the intensity of the light is equally distributed to the end sections 31a and 31b, respectively.

When the reflected return light is created at the reflecting boundary 22, the reflected return light passes through the 2×2 MMI coupler 31 one more time, whereby it is coupled to the port 34 of the 2×2 MMI coupler 31 from the coherence of light of the optical coupler, and then is led to the light-absorbing region 21 and is absorbed thereinto.

In addition, the light transmitted through the reflecting boundary 22 is input to the 2×2 MMI coupler 30, and passes through the 2×2 MMI coupler 30 once, whereby the majority of the light is coupled to the port 32, and is hardly coupled to the port 33.

Subsequently, operations and effects of the exemplary embodiment will, be described. In the optical joint 1 according to the exemplary embodiment, the configuration is adopted in which the 2×2 MMI interference coupler 30 having the port 32 and the port 33 and the 2×2 MMI interference coupler 31 having the port 34 and the port 35 are joined to each other with the reflecting boundary 22 interposed therebetween, and the light-absorbing regions 20 and 21 are provided to the port 33 and the port 34, respectively. Thereby, in the first mode in which light is input from the port 32, by using the principle of the coherence of light of the optical coupler, the reflected return light created at the reflecting boundary 22 is coupled to the port 33 and thus can be absorbed into the light-absorbing region 20. On the other hand, in the second mode in which light is input from the port 35, the reflected return light created at the reflecting boundary 22 is coupled to the port 34 and thus can be absorbed into the light-absorbing region 21. Therefore, it is possible to locally consolidate the reflected return light created at the reflecting boundary 22, and to suppress the incidence of the reflected return light on other integrated devices. Consequently, it is possible to improve the final performance of the optical integrated device.

Second Exemplary Embodiment

Figure 2:
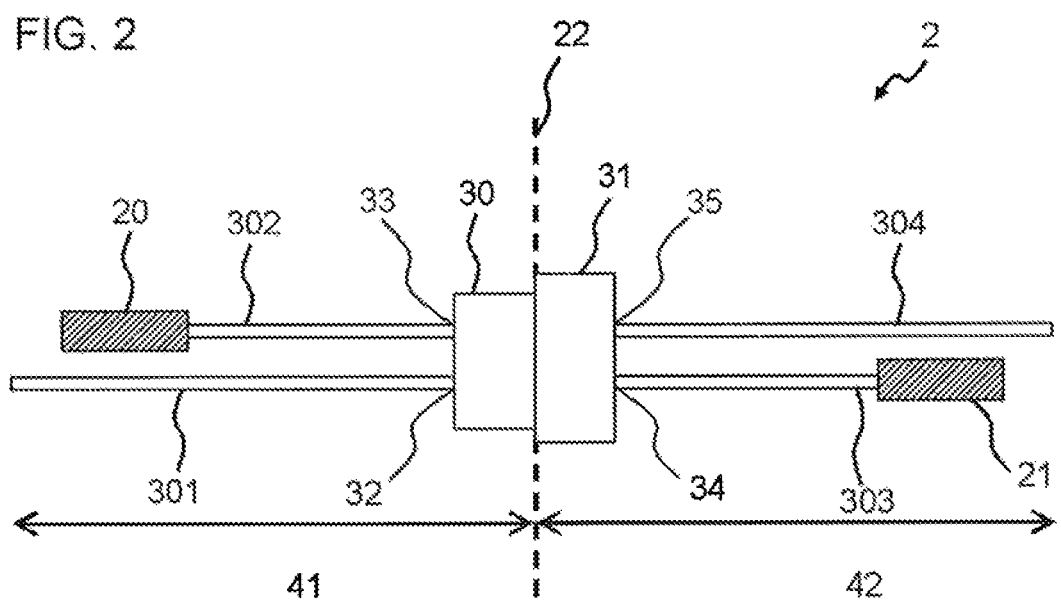
FIG. 2 is a plan view illustrating the optical joint according to a second exemplary embodiment.

FIG. 2 is a plan view illustrating an optical joint 2 according to the exemplary embodiment. In the optical joint 2, the 2×2 MMI coupler 30 and the 2×2 MMI coupler 31 are formed of different materials. Specifically, the 2×2 MMI coupler 30 is formed of a material 41, and the 2×2 MMI coupler 31 is formed of a material 42. Other configurations are the same as those of the optical joint 1.

As the materials 41 and 42, for example, a compound semiconductor-based material, a quartz-based material, a silicon-based material can be used. For example, a compound semiconductor-based material can be used as the material 41, and a quartz-based material can be used as the material 42. In addition, a compound semiconductor-based material may be used as the material 41, and a silicon-based material may be used as the material 42. In addition, a silicon-based material may be used as the material 41, and a quartz-based material may be used as the material 42.

In the optical joint 2, the junction portion formed of a different material becomes the reflecting boundary 22. However, the reflected return light generated at the reflecting boundary 22 is led to the light-absorbing regions 20 and 21 through the same principle as that of the optical joint 1, and is absorbed thereinto. Therefore, while the influence of the reflected return light on other elements is suppressed, it is possible to integrate the elements using materials suitable to each of the elements. Consequently, final performance of the integrated optical device is improved.

Third Exemplary Embodiment

Figure 3:
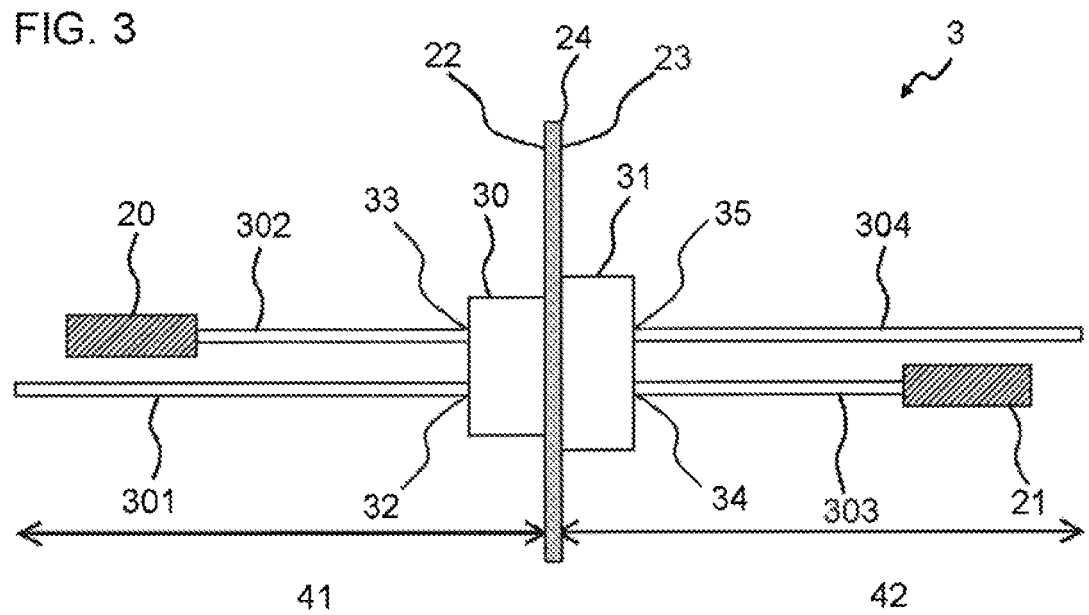
FIG. 3 is a plan view illustrating the optical joint according to a third exemplary embodiment.

FIG. 3 is a plan view illustrating an optical joint 3 according to the exemplary embodiment. In the optical joint 3, a filler 24 is filled into the junction portion between the 2×2 MMI coupler 30 and the 2×2 MMI coupler 31. In addition, the 2×2 MMI coupler 30 is formed of the material 41, and the 2×2 MMI coupler 31 is formed of the material 42. Other configurations are the same as those of the optical joint 1.

The optical joint 3 is configured such that the 2×2 MMI coupler 30 and the 2×2 MMI coupler 31 are formed using different materials, and the 2×2 MMI coupler 30 and the 2×2 MMI coupler 31 are connected to each other with the filler 24 interposed therebetween. Thereby, the reflecting boundary 22 that reflects the light propagated through the 2×2 MMI coupler 30 and the reflecting boundary 23 that reflects the light propagated through the 2×2 MMI coupler 31 are respectively formed.

Here, when the refractive indexes of the 2×2 MMI coupler 30 and the 2×2 MMI coupler 31, respectively, satisfy the following Expression (5), it is known the reflected return light created at the reflecting boundaries 22 and 23 can be minimized.

[Expression 5]

$$nd = \lambda_0(2m+1)/4 \ (m=0,1,2\ldots) \tag{5}$$

Consequently, it is preferable to use a material having a refractive index, that satisfies the following Expression (6), as a filling material because generation of the reflected return light at the reflecting boundaries 22 and 23 can be suppressed. Meanwhile, n denotes a refractive index of a filler, d denotes a width of the filler which is filled between materials, and $\lambda_0$ denotes a wavelength of incident light. In addition, the refractive index of the material 41 is set to $n_1$, and the refractive index of the material 42 is set to $n_2$. A specific example of the filling material includes alumina, SiN, SiO$_2$ and the like.

[Expression 6]

$$n=\sqrt{n_1 n_2} \qquad (6)$$

In the optical joint 3, when materials having different refractive indexes are connected to each other, it is possible to suppress the generation of the reflected return light at the reflecting boundary 22 or the reflecting boundary 23 by using the filler 24 having a proper refractive index. In addition, the generated reflected return light is consolidated into the light-absorbing regions 20 and 21 through the same principle as that of the optical joint 1 and thus loss in the optical integrated device can be reduced.

Fourth Exemplary Embodiment

Figure 4:
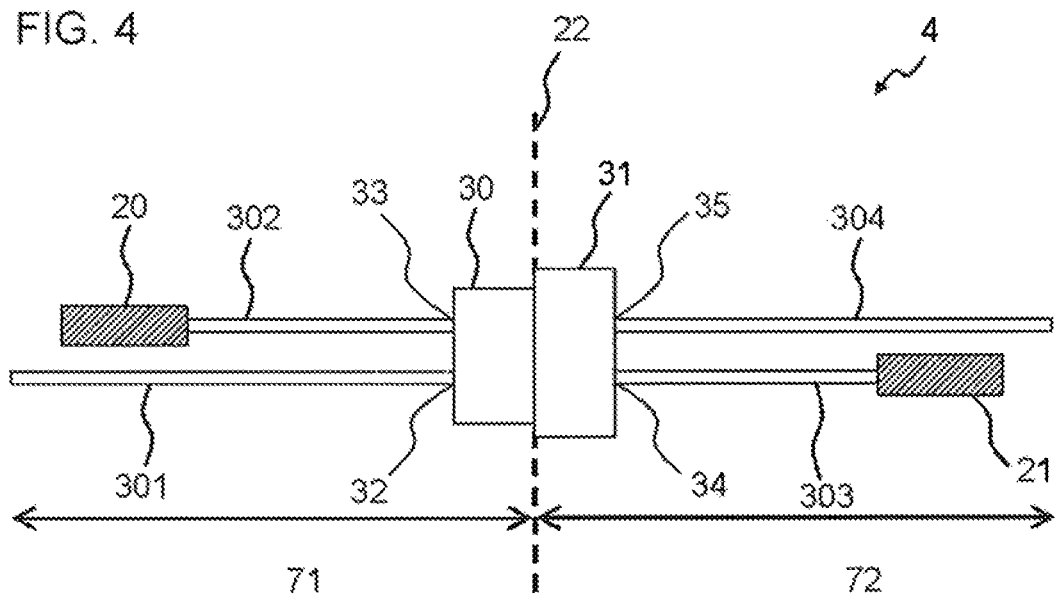
FIG. 4 is a plan view illustrating the optical joint according to a fourth exemplary embodiment.

FIG. 4 is a plan view illustrating an optical joint 4 according to the exemplary embodiment. In the optical joint 4, the 2×2 MMI coupler 30 and the 2×2 MMI coupler 31 are formed to have different structures. Specifically, the 2×2 MMI coupler 30 is formed to have a structure 71, and the 2×2 MMI coupler 31 is formed to have a structure 72. Other configurations are the same as those of the optical joint 1.

For example, an embedded waveguide structure can be adopted as the structure 71. In addition, a deep-ridge waveguide structure can be adopted as the structure 72. Thereby, the junction portion between the structure 71 and the structure 72 becomes the reflecting boundary 22, and the reflected return light is generated at the reflecting boundary 22. However, through the same principle as that of the optical joint 1, the reflected return light is led to the light-absorbing regions 21 and 22, and is absorbed thereinto. Therefore, while the influence of the reflected return light on other elements is suppressed, it is possible to use materials suitable to each of the elements to be integrated. Consequently, final performance of the integrated optical device is improved.

In addition, an active region may be adopted as the structure 71, and a passive region may be adopted as a structure 72. Thereby, the junction portion between the structure 71 and the structure 72 becomes the reflecting boundary 22, the reflected return light is generated at the reflecting boundary 22. However, through the same principle as that of the optical joint 1, the reflected return light is led to the light-absorbing regions 21 and 22, and is absorbed thereinto. Therefore, while the influence of the reflected return light on other elements is suppressed, it is possible to use materials suitable to each of the elements to be integrated. Consequently, the final performance of the integrated optical device is improved.

Fifth Exemplary Embodiment

Figure 5:
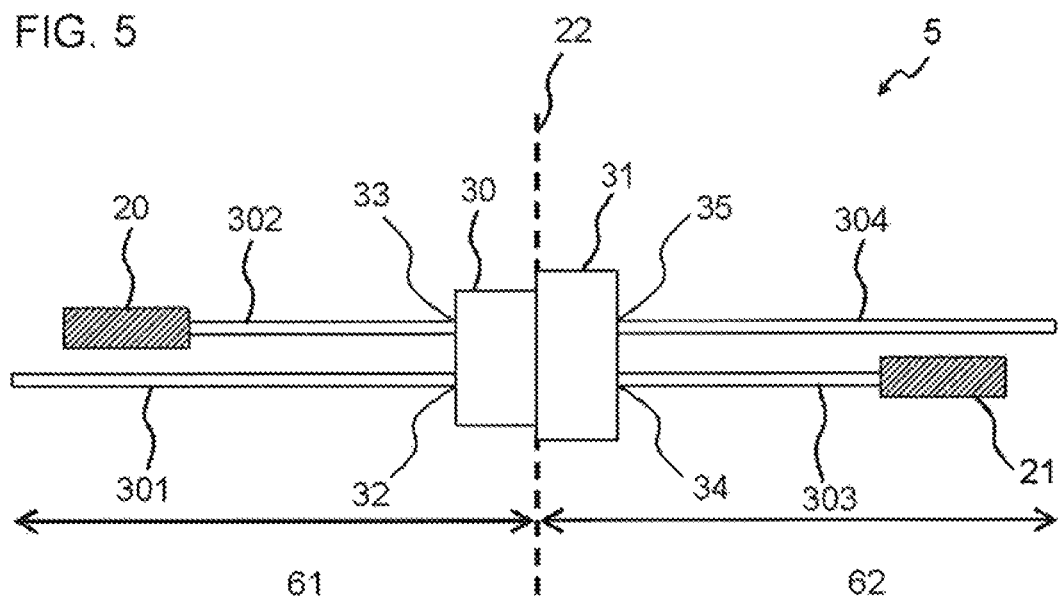
FIG. 5 is a plan view illustrating the optical joint according to a fifth exemplary embodiment.

FIG. 5 is a plan view illustrating an optical joint 5 according to the exemplary embodiment. In the optical joint 5, the 2×2 MMI coupler 30 and the 2×2 MMI coupler 31 are formed to have different waveguide structures. Specifically, the 2×2 MMI coupler 30 is formed to have a waveguide structure 61, and the 2×2 MMI coupler 31 is formed to have a waveguide structure 62. Other configurations are the same as those of the optical joint 1.

For example, in the optical joint 5, the waveguide structure 61 can be formed to have an embedded waveguide structure, and the waveguide structure 62 can be formed to have a rib waveguide structure. In addition, the waveguide structure 61 may be formed to have a rib waveguide structure, and the waveguide structure 62 may be formed to have a deep-ridge waveguide structure. In addition, the waveguide structure 61 may be formed to have an embedded waveguide structure, and the waveguide structure 62 may be formed to have a deep-ridge waveguide structure.

In the optical joint 5, the junction portion between the waveguide structure 61 and the waveguide structure 62 becomes the reflecting boundary 22, the reflected return light is created at the reflecting boundary 22. However, through the same principle as that of the optical joint 1, the reflected return light is led to the light-absorbing regions 20 and 21, and is absorbed thereinto. Therefore, while the influence of the reflected return light on other elements is suppressed, it is possible to use materials suitable to each of the elements to be integrated. Consequently, final performance of the integrated optical device is improved.

Meanwhile, core structures of the 2×2 MMI coupler 30 and the 2×2 MMI coupler 31 can all be formed in the passive region. For example, in the case of a compound semiconductor-based material, both of the core structures of the 2×2 MMI coupler 30 and the 2×2 MMI coupler 31 are formed of a layer having a large band-gap energy. For example, the core structures of the 2×2 MMI coupler 30 and the 2×2 MMI coupler 31 can be formed of materials, such as InGaAsP or InGaAlAs, of which the wavelength equivalent of the band gap is 1.05 to 1.45 μm.

Sixth Exemplary Embodiment

Figure 6:
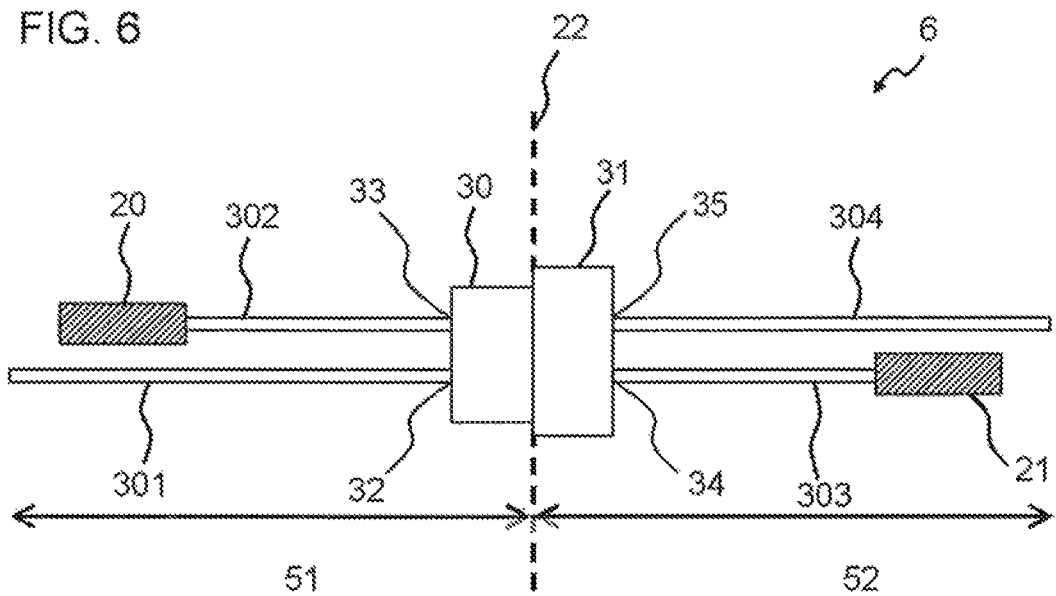
FIG. 6 is a plan view illustrating the optical joint according to a sixth exemplary embodiment.
Figure 7:
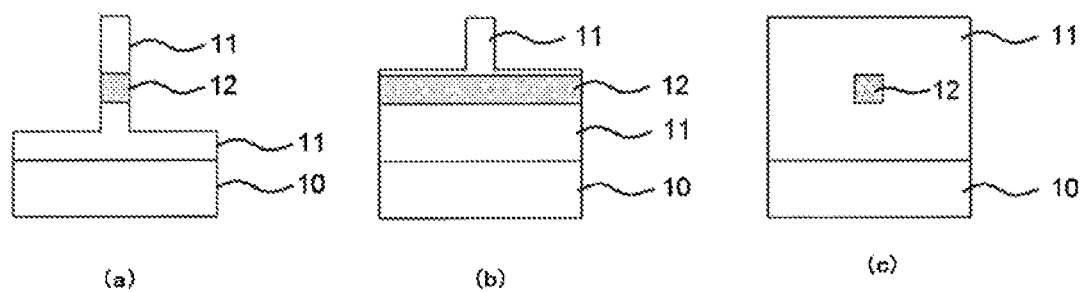
FIG. 7 is a diagram for explaining a waveguide structure.

FIG. 6 is a plan view illustrating an optical joint 6 according to the exemplary embodiment. In the optical joint 6, the 2×2 MMI coupler 30 and the 2×2 MMI coupler 31 are respectively formed of different core compositions. Specifically, in the optical joint 6, the 2×2 MMI coupler 30 is formed of an active region 51, and the 2×2 MMI coupler 31 is formed of a passive region 52.

The active region 51 and the passive region 52 can have different physical properties by changing the types of constituent atom materials. Atoms such as Al, Ga, In, N, P, As, and Sb are often used in the optical device. Specifically, the core of the active region 51 is formed of a layer having a small band-gap energy in order to obtain an optical gain in the objective wavelength. On the other hand, the core of the passive region 52 is formed of a layer having a large band-gap energy. Though the band gap can be adjusted by crystal distortion caused by the layer thickness, the crystal composition ratio, and the crystal composition ratio, for example, the active region 51 can be formed of materials, such as InGaAsP or InGaAlAs, of which the wavelength equivalent of the band gap is 1.47 to 1.63 μm, and the passive region 52 can be formed of materials, such as InGaAsP or InGaAlAs, of which the wavelength equivalent of the band gap is 1.05 to 1.45 μm. The active region 51 can be formed as a laser, an LED, an optical amplifier, a photodetector and the like. On the other hand, the passive region 52 can be formed as a modulator, an optical filter and the like.

In the optical joint 6, the 2×2 MMI coupler 30 and the 2×2 MMI coupler 31 are formed using a separate core structure. In the optical joint 6, the junction portion between the active region 51 and the passive region 52 becomes the reflecting boundary 22, and the reflected return light is created at the reflecting boundary 22. However, through the same principle as that of the optical joint 1, the reflected return light is led to the light-absorbing regions 20 and 21, and is absorbed thereinto. Therefore, while the influence of the reflected return light on other elements is suppressed, it is possible to use materials suitable to each of the elements to be integrated. Consequently, the final performance of the integrated optical device is improved.

In the optical joints according to each of the exemplary embodiments describe above, it is possible to suppress the influence of the reflected return light on the semiconductor laser by leading the reflected light generated at the reflecting boundary to the light-absorbing region. Thereby, a novel device structure is provided which is capable of realizing the optical integrated device in which a waveguide structure and a core structure, most suitable to each of the regions, are disposed.

In the optical joints according to each of the above-mentioned exemplary embodiments, the intensity of the light incident from the port 32 of the 2×2 MMI coupler 30 is equally distributed to two points at the end on the side opposite to the incidence in the 2×2 MMI coupler 30. The reflected light from the reflecting boundary 22 passes through the 2×2 MMI coupler 30 twice, whereby it is coupled to the port 33 of the 2×2 MMI coupler 30 from the coherence of light of the optical coupler, and then is led to the light-absorbing region 20 and is absorbed thereinto. As a result, the reflected return light passing through the port of the 2×2 MMI coupler 30 is suppressed, thereby allowing the semiconductor laser to stably operate.

An application example of the optical joints according to theses exemplary embodiments includes a long-range light source for wavelength multiplex communication used in the artery system and the access system.

As described above, although the exemplary embodiments of the invention have been set forth with reference to the drawings, they are merely illustrative of the invention, and various configurations other than those stated above can be adopted.

For example, the following aspects can also be applied to the invention.

(1) An optical joint that propagates light, including:
a first 2×2 multimode interference (MMI) coupler (hereinafter, referred to as a 2×2 MMI coupler) and a second 2×2 MMI coupler,
wherein the first 2×2 MMI coupler includes a port 1 and a port 2 at one side, and
the second 2×2 MMI coupler includes a port 3 and a port 4 at one side,
the port 1 of the first 2×2 MMI coupler and a port on the side opposite to the port 2, and the port 3 of the second 2×2 MMI coupler and a port on the side opposite to the port 4 are connected facing each other,
a light-absorbing region 1 is connected to the port 2, and a light-absorbing region 2 is connected to the port 3, and
a reflecting boundary is included in the connection point.
(2) The optical joint as set forth in the above (1), wherein the first 2×2 MMI coupler and the second 2×2 MMI coupler are formed of different materials.
(3) The optical joint as set forth in the above (1) or (2), wherein a filler is used in a junction portion of a boundary between materials.
(4) The optical joint as set forth in the above (2), wherein the first 2×2 MMI coupler is formed of a compound semiconductor-based material, and the second 2×2 MMI coupler is a quartz-based material.
(5) The optical joint as set forth in the above (2), wherein the first 2×2 MMI coupler is formed of a compound semiconductor-based material, and the second 2×2 MMI coupler is formed of a silicon-based material.
(6) The optical joint as set forth in the above (2), wherein the first 2×2 MMI coupler is formed of a silicon-based material, and the second 2×2 MMI coupler is formed of a quartz-based material.
(7) The optical joint as set forth in the above (1) to (6), wherein the first 2×2 MMI coupler and the second 2×2 MMI coupler are formed to have different structures.
(8) The optical joint as set forth in the above (1) to (7), wherein the first 2×2 MMI coupler is formed to have an embedded waveguide structure, and the second 2×2 MMI coupler is formed to have a rib waveguide structure.
(9) The optical joint as set forth in the above (1) to (7), wherein the first 2×2 MMI coupler is formed to have a rib waveguide structure, and the second 2×2 MMI coupler is formed to have a deep-ridge waveguide structure.
(10) The optical joint as set forth in the above (1) to (7), wherein the first 2×2 MMI coupler is formed to have an embedded waveguide structure, and the second 2×2 MMI coupler is formed to have a deep-ridge waveguide structure.
(11) The optical joint as set forth in the above (1) to (7), wherein the first 2×2 MMI coupler is formed of an active region, and the second 2×2 MMI coupler is formed of a passive region.
(12) The optical joint as set forth in the above (1) to (7), wherein the first 2×2 MMI coupler is formed of a passive region, and the second 2×2 MMI coupler is also formed of a passive region.

Meanwhile, the above-mentioned exemplary embodiments and multiple modified examples can, of course, be combined within the range of not being contrary to the content thereof. Moreover, in the above-mentioned exemplary embodiments and modified examples, although the structures and the like of each part have been described in detail, the structures thereof and the like can be variously changed within the range of satisfying the invention.

While the present invention has been described with reference to the exemplary embodiments, it is apparent to those skilled in the art that the invention is not limited to the above exemplary embodiments, and may be modified and changed without departing from the scope and spirit of the invention.

DESCRIPTION OF REFERENCE NUMERALS AND SIGNS

1 OPTICAL JOINT
2 OPTICAL JOINT
3 OPTICAL JOINT
4 OPTICAL JOINT
5 OPTICAL JOINT
6 OPTICAL JOINT
10 SUBSTRATE
11 CLAD
12 CORE
20 LIGHT-ABSORBING REGION
21 LIGHT-ABSORBING REGION
22 REFLECTING BOUNDARY
23 REFLECTING BOUNDARY
24 FILLER
30 2×2 MMI COUPLER
30a PORT
30b PORT
31 2×2 MMI COUPLER
31a PORT
31b PORT
32 PORT
33 PORT

34 PORT
35 PORT
41 MATERIAL
42 MATERIAL
51 ACTIVE REGION
52 PASSIVE REGION
61 WAVEGUIDE STRUCTURE
62 WAVEGUIDE STRUCTURE
71 STRUCTURE
72 STRUCTURE
301 OPTICAL WAVEGUIDE
302 OPTICAL WAVEGUIDE
303 OPTICAL WAVEGUIDE
304 OPTICAL WAVEGUIDE

The invention claimed is:

1. An optical joint comprising:
a first multimode interference coupler; and
a second multimode interference coupler joined to said first multimode interference coupler,
wherein said first multimode interference coupler includes a first port and a second port at one side, and a third port and a fourth port at the other side,
said second multimode interference coupler includes a fifth port and a sixth port at one side, and a seventh port and an eighth port at the other side,
said third port and said fifth port are joined to each other,
said fourth port and said sixth port are joined to each other,
a first light-absorbing section is connected to said second port,
a second light-absorbing section is connected to said seventh port, and
a reflecting boundary that reflects light propagated through said first multimode interference coupler or said second multimode interference coupler is provided to a junction portion between said first multimode interference coupler and said second multimode interference coupler.

2. The optical joint according to claim 1, wherein said first multimode interference coupler and said second multimode interference coupler are formed of different materials.

3. The optical joint according to claim 2, said first multimode interference coupler is formed of a compound semiconductor-based material, and said second multimode interference coupler is formed of a quartz-based material.

4. The optical joint according to claim 2, wherein said first multimode interference coupler is formed of a compound semiconductor-based material, and said second multimode interference coupler is formed of a silicon-based material.

5. The optical joint according to claim 2, wherein said first multimode interference coupler is formed of a silicon-based material, and said second multimode interference coupler is formed of a quartz-based material.

6. The optical joint according to claim 1 a filler is filled into said junction portion.

7. The optical joint according to claim 1, wherein said first multimode interference coupler and said second multimode interference coupler are formed to have different structures.

8. The optical joint according to claim 7, wherein said first multimode interference coupler is formed to have an embedded waveguide structure, and said second multimode interference coupler is formed to have a rib waveguide structure.

9. The optical joint according to claim 7, wherein said first multimode interference coupler is formed to have a rib waveguide structure, and said second multimode interference coupler is formed to have a deep-ridge waveguide structure.

10. The optical joint according to claim 7, wherein said first multimode interference coupler is formed to have an embedded waveguide structure, and said second multimode interference coupler is formed to have a deep-ridge waveguide structure.

11. The optical joint according to claim 7, wherein said first multimode interference coupler is formed of an active region, and said second multimode interference coupler is formed of a passive region.

12. The optical joint according to claim 1, wherein both of said first and second multimode interference couplers are all formed of a passive region.

* * * * *